United States Patent
Shen et al.

(10) Patent No.: US 9,287,897 B2
(45) Date of Patent: Mar. 15, 2016

(54) SYSTEMATIC RATE-INDEPENDENT REED-SOLOMON ERASURE CODES

(71) Applicant: Broadcom Corporation, Irvine, CA (US)

(72) Inventors: Bazhong Shen, Irvine, CA (US); Erik Stauffer, Mountain View, CA (US)

(73) Assignee: Broadcom Corporation, Irvine, CA (US)

( * ) Notice: Subject to any disclaimer, the term of this patent is extended or adjusted under 35 U.S.C. 154(b) by 438 days.

(21) Appl. No.: 13/754,334

(22) Filed: Jan. 30, 2013

(65) Prior Publication Data

US 2013/0198583 A1      Aug. 1, 2013

Related U.S. Application Data (60) Provisional application No. 61/592,221, filed on Jan. 30, 2012, provisional application No. 61/601,284, filed on Feb. 21, 2012, provisional application No. 61/614,928, filed on Mar. 23, 2012, provisional application No. 61/645,893, filed on May 11, 2012, provisional application No. 61/647,266, filed on May 15, 2012.

(51) Int. Cl.
*H03M 13/45* (2006.01)
*H03M 13/15* (2006.01)
*H03M 13/35* (2006.01)
*H03M 13/00* (2006.01)
*H03M 13/53* (2006.01)
*H03M 13/37* (2006.01)

(52) U.S. Cl.
CPC .......... *H03M 13/15* (2013.01); *H03M 13/1515* (2013.01); *H03M 13/353* (2013.01); *H03M 13/6516* (2013.01); *H03M 13/373* (2013.01)

(58) Field of Classification Search
CPC ............ H03M 13/15; H03M 13/1515; H03M 13/353; H03M 13/6516; H03M 13/373; H03M 13/151
See application file for complete search history.

(56) References Cited

U.S. PATENT DOCUMENTS

| | | | |
|---|---|---|---|
| 2001/0019310 A1* | 9/2001 | Luby | 341/50 |
| 2008/0115041 A1* | 5/2008 | Park et al. | 714/785 |
| 2010/0299699 A1* | 11/2010 | Citta et al. | 725/32 |
| 2012/0011413 A1* | 1/2012 | Liu et al. | 714/746 |

* cited by examiner

*Primary Examiner* — April Y Blair
*Assistant Examiner* — Dipakkumar Gandhi
(74) *Attorney, Agent, or Firm* — Sterne, Kessler, Goldstein & Fox P.L.L.C.

(57) ABSTRACT

The present disclosure is directed to a system and method for encoding k input symbols, using a Reed-Solomon erasure correction code, into a longer stream of n output symbols for transmission over an erasure channel. The present disclosure is further directed to a system and method for recovering the original k input symbols from only (and any) k output symbols (out of the n output symbols) received over the erasure channel. A symbol is a generic data unit consisting of one or more bits that can be, for example, a packet. The systems and methods of the present disclosure provide for an adjustable code rate that can be readily adapted based on changing channel conditions without having to reconstruct the encoder/decoder. As a result, such an encoder/decoder can be referred to as rate-independent.

20 Claims, 6 Drawing Sheets

SYSTEMATIC RATE-INDEPENDENT REED-SOLOMON ERASURE CODES

CROSS REFERENCE TO RELATED APPLICATIONS

This application claims the benefit of U.S. Provisional Patent Application No. 61/592,221, filed Jan. 30, 2012, U.S. Provisional Patent Application No. 61/601,284, filed Feb. 21, 2012, U.S. Provisional Patent Application No. 61/614,928, filed Mar. 23, 2012, U.S. Provisional Patent Application No. 61/645,893, filed May 11, 2012, and U.S. Provisional Patent Application No. 61/647,266, filed May 15, 2012, all of which are incorporated herein by reference.

TECHNICAL FIELD

This application relates generally to coding of symbols for transmission over an erasure channel and, more particularly, to systematic rate-independent coding of symbols for transmission over a packet erasure channel.

BACKGROUND

The packet erasure channel is a communication channel model where transmitted packets are either received or lost, and the location of any lost packet is known. The Internet usually can be modeled as a packet erasure channel. This is because packets transmitted over the Internet can be lost due to corruption or congestion, and the location of any lost packet can be inferred from a sequence number included in a header or payload of each received packet.

Depending on the type of data carried by a stream of packets, a lost packet can reduce the quality of the data or even render the data unusable at a receiver. Therefore, recovery schemes are typically used to provide some level of reliability that packets transmitted over an erasure channel will be received. For example, retransmission schemes are used to recover lost packets in many packet-based networks, but retransmissions can result in long delays when, for example, there is a large distance between the transmitter and receiver or when the channel is heavily impaired. For this reason and others, forward error correction (FEC) using an erasure code is often implemented in place of, or in conjunction with, conventional retransmission schemes.

An erasure code encodes a stream of k packets into a longer stream of n packets such that the original stream of k packets can be recovered at a receiver from a subset of the n packets without the need for any retransmission. The performance of an erasure code can be characterized based on its reception efficiency. The reception efficiency of an erasure code is given by the fraction k'/k, where k' is the minimum number of the n packets that need to be received in order to recover the original stream of k packets. Certain erasure codes have optimal reception efficiency (i.e., the highest obtainable reception efficiency) and can recover the original stream of k packets using only (and any) k packets out of the n packets transmitted. Such codes are said to be maximum distance separable (MDS) codes.

The Reed-Solomon code is an MDS code with optimal reception efficiency, but the conventional implementation of its encoder/decoder is generally inflexible. Specifically, the conventional Reed-Solomon encoder/decoder has a fixed code rate that cannot be adjusted without first reconstructing the encoder/decoder, which can consume a considerable amount of time and processing power. The code rate is the proportion of an encoded data-stream carrying useful (i.e., non-redundant) information and is given by k/n, where for every k bits of useful information, n total bits are generated, of which n−k bits are redundant.

An encoder with an adjustable code rate is beneficial because the proportion of redundant information generated can be adapted based on the conditions of the erasure channel over which the packets are to be transmitted to improve reliability and/or the data rate. For example, for a bad channel, an adjustable encoder can use a lower code rate to improve reliability, and for a good channel, the adjustable encoder can use a higher code rate to improve the data rate.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

The embodiments of the present disclosure will be described with reference to the accompanying drawings. The drawing in which an element first appears is typically indicated by the leftmost digit(s) in the corresponding reference number.

DETAILED DESCRIPTION

In the following description, numerous specific details are set forth in order to provide a thorough understanding of the embodiments of the present disclosure. However, it will be apparent to those skilled in the art that the embodiments, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring aspects of the disclosure.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

1. OVERVIEW

The present disclosure is directed to a system and method for encoding k input symbols, using a Reed-Solomon erasure code, into a longer stream of n output symbols for transmission over an erasure channel. The present disclosure is further directed to a system and method for recovering the original k input symbols from only (and any) k output symbols (of the n output symbols) received over the erasure channel. A symbol is a generic data unit consisting of one or more bits that can be, for example, a packet. The systems and methods of the present disclosure provide for an adjustable code rate that can be readily adapted based on changing channel conditions without having to reconstruct the encoder/decoder. As a result, such an encoder/decoder can be referred to as rate-independent.

2. REED-SOLOMON ERASURE CODES

The basic principle of Reed-Solomon erasure codes can be viewed in many different ways. The systems and methods of the present disclosure are based on one particular view of the basic principle of Reed-Solomon erasure codes that can be explained by way of the following example.

Suppose that a transmitting device needs to send two data values, '5' and '7', to a receiving device over an erasure channel (i.e., a channel where transmitted values are either received or lost, and the location of any lost value among the sequence of transmitted values is known). These two data values can be represented by two points in a plane, such as the x-y plane 100 shown in FIG. 1. The first data value '5' is located at the position $\chi=1$ and is represented by the point (1, 5), and the second data value '7' is located at the position $\chi=2$ and is represented by the point (2, 7). The two points (1, 5) and (2, 7) determine a line 102.

Figure 1:
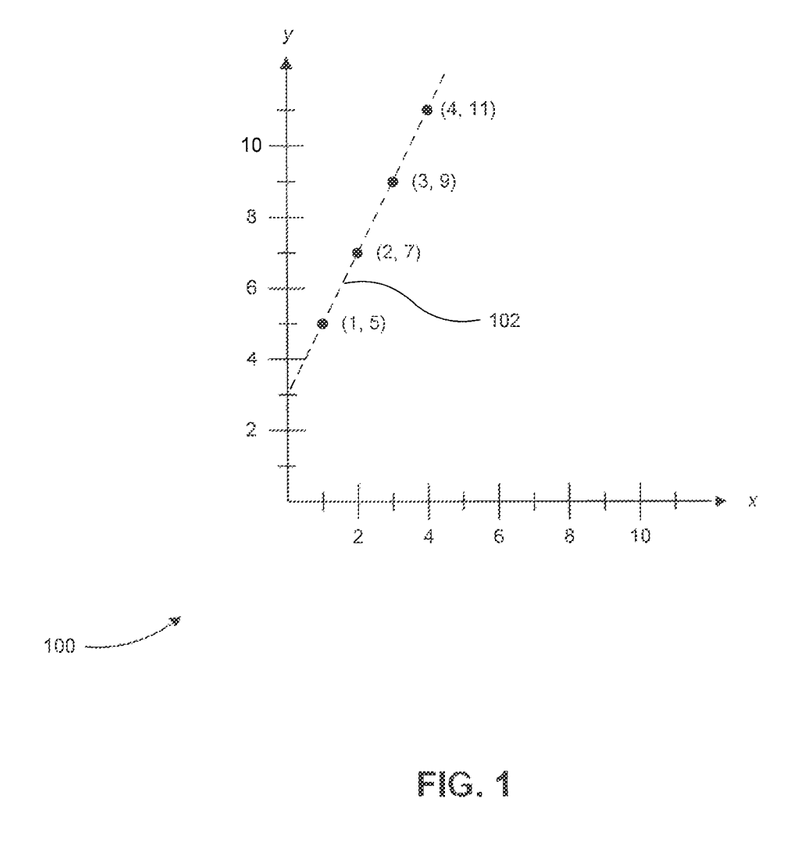
FIG. 1 illustrates an example Reed-Solomon code in accordance with embodiments of the present disclosure.

To allow for the recovery of erasures (i.e., a lost data value) at the receiving device, the transmitting device can send, in addition to the two data values '5' and 7', redundant information that falls on line 102. For example, the transmitting device can send the following sequence of values: '5', '7', '9', '11'. The last two values, '9' and '11', are redundant information values that are located on line 102 at respective positions $\chi=3$ and $\chi=4$. As long as the receiving device receives any two of the four transmitted values, it can be shown that the receiver can recover the data values '5' and '7'.

For example, assume the receiving device receives just redundant information values '9' and '11', or the sequence of values '?', '?', '9', '11', where '?' represents an erasure. The receiver knows that the received value '9' corresponds to the point (3, 9) and the received value '11' corresponds to the point (4, 11). Based on this knowledge, the receiver can determine the function that describes line 102 and evaluate that function at $\chi=1$ and $\chi=2$ to respectively recover the erased data values '5' and '7'. Any two points received are sufficient to recover the original data values '5' and '7' because two points determine line 102.

The process of generating the redundant information values can be referred to as Reed-Solomon erasure encoding, and the process of recovering the original data values can be referred to as Reed-Solomon erasure decoding. An encoder at the transmitting device can perform the encoding, and a decoder at the receiving device can perform the decoding.

The above example illustrates the basic principle of Reed-Solomon erasure codes based on the encoding/decoding of two data values that correspond to points in a plane that determine a line. In general, the principle illustrated by the above example can be used to encode/decode any number of data values (up to some practical limit) that correspond to points in a plane that determine a unique polynomial. For example, if k data values are to be transmitted, it can be shown that those k data values correspond to k points in a plane that determine a unique degree k−1 polynomial of the form:

$$f(\chi) = y = f_{k-1}\chi^{k-1} + f_{k-2}\chi^{k-2} + \ldots + f_2\chi^{k-2} + f_1\chi + f_0 \quad (1)$$

Once a polynomial of the form in Eq. 1 is determined, the polynomial can be evaluated at n−k unique $\chi$ positions (each different from the $\chi$ positions of the k original points) to determine n−k redundant values. The k original data values and the n−k redundant values can then be transmitted to a receiver. As long as the receiver receives any k of the n total transmitted values, the receiver can determine the polynomial of the form in Eq. 1 and evaluate the polynomial at the $\chi$ positions corresponding to any erased ones of the original k data values to recover them.

Importantly, the number of redundant values n−k generated by the encoder at the transmitting device can be adjusted either up or down by evaluating the polynomial at additional or fewer unique $\chi$ positions. This corresponds to adjusting the value n, which advantageously does not require the polynomial of the form in Eq. 1 to be reconstructed (because it does not depend on n), or equivalently to adjusting the code rate, which defines the proportion of an encoded data-stream carrying useful (i.e., non-redundant) information.

An encoder with an adjustable code rate is beneficial because the proportion of redundant information generated can be adapted based on the conditions of the erasure channel over which the data values are to be transmitted to improve reliability and/or the data rate. For example, for a bad channel, an adjustable encoder can use a lower code rate to improve reliability, and for a good channel, the adjustable encoder can use a higher code rate to improve the data rate.

Before describing further implementation details of an encoder and decoder that implement the basic principle of Reed-Solomon erasure codes as described above, it is important to note that the above example assumed $\chi$ and y in Eq. 1 are real variables and that the coefficients of the polynomial in Eq. 1 are real numbers. However, in most practical encoder and decoder implementations, the variables $\chi$ and y and the coefficients are taken from a finite field; i.e., a finite set of values or symbols that can be added, subtracted, multiplied, and divided in a manner similar to real numbers.

For example, in practical encoder and decoder implementations, the variables $\chi$ and y and the coefficients of the polynomial of the form in Eq. 1 are taken from the finite field consisting of the $2^m$ binary vectors (also referred to as symbols) of dimension m. When the polynomial of the form in Eq. 1 is evaluated at a value of $\chi$ equal to one of the $2^m$ binary vectors of dimension m, the resultant value of y is also one of the $2^m$ binary vectors of dimension m. Given this, everything described above remains true, except now n must be less than or equal to $2^m$. This is because there are at most $2^m$ distinct values that can be substituted for $\chi$ in the polynomial of the form in Eq. 1.

The elements of a finite field consisting of the $2^m$ binary vectors of dimension m can be written as the set $\mathbb{F} = \{0, \alpha^0, \alpha^1, \alpha^2, \alpha^{2m-2}\}$, where $\alpha$ is a primitive element of the finite field. A function $\rho(\chi)$, where $\chi$ is an integer in the set $\mathbb{Z} = \{0, 1, 2, 3, \ldots, 2^m-1\}$, can be defined that performs a one-to-one mapping of the integer set $\mathbb{Z}$ to the finite field set $\mathbb{F}$; in other words, the function $\rho(\chi)$ returns the element from the finite field set $\mathbb{F}$ that corresponds to $\chi$ in the integer set $\mathbb{Z}$, where $\rho(0)$ returns 0, $\rho(1)$ returns $\alpha^0$, $\rho(2)$ returns $\alpha^1$, etc. The description below makes repeated use of this function.

3. ENCODER/DECODER AND TRANSMIT/RECEIVE PAYLOAD PROCESSOR

This section begins by describing an encoder and a transmit payload processor configured to implement the basic principle of Reed-Solomon erasure codes as described above in Section 2 in accordance with embodiments of the present disclosure. Such an encoder and transmit payload processor can use Lagrange interpolation to determine a unique degree k−1 polynomial, equivalent to the form in Eq. 1, that interpolates k points in a plane corresponding to k symbols to be transmitted, where the k symbols carry useful (i.e., non-redundant) information and are taken from the finite field consisting of the $2^m$ binary vectors of dimension m. The unique polynomial can be used by the encoder and transmit payload processor to generate n−k redundant symbols for transmission, along with the original k symbols, over an erasure channel. The variable n can be adjusted without having to reconstruct the unique polynomial because, as will be shown below, the unique polynomial does not depend on n.

For example, given the set of k symbols $\{y_0, y_1, y_2, \ldots, y_{k-1}\}$ carrying useful (i.e., non-redundant) information and taken from the finite field consisting of the $2^m$ binary vectors of dimension m, a corresponding unique set of k points $\{(\chi_0, y_0), (\chi_1, y_1), (\chi_2, y_2), \ldots, (\chi_{k-1}, y_{k-1})\}$ in a plane can be defined, where $\{\chi_0, \chi_1, \chi_2, \ldots, \chi_{k-1}\}$ is equal to the set of consecutive integers from 0 to k−1 for exemplary purposes. The interpolation polynomial in Lagrange form that interpolates the set of k points is given by the following linear combination of basis polynomials:

$$f_{enc}(x) = \sum_{j=0}^{k-1} y_j b_j(x) \quad (2)$$

where $b_j(x)$ are the basis polynomials and are given by:

$$b_j(x) = \prod_{t=0, t\neq j}^{k-1} \frac{\rho(x) - \rho(x_t)}{\rho(x_j) - \rho(x_t)}, \quad 0 \leq x \leq 2^m \quad (3)$$

The function $\rho(\chi)$ was defined above in Section 2 and returns the element from the finite field set $\mathbb{F} = \{0, \alpha^0, \alpha^1, \alpha^2, \ldots, \alpha^{2m-2}\}$, where $\alpha$ is a primitive element of the finite field, that corresponds to $\chi$ in the integer set $\mathbb{Z} = \{0, 1, 2, 3, \ldots, 2^m-1\}$.

The interpolation polynomial in Eq. 2 represents the encoding function and is thus named $f_{enc}(\chi)$. The encoding function $f_{enc}(\chi)$ can be evaluated at n−k unique values of $\chi$ (each different from the $\chi$ values of the k original points) to obtain n−k redundant symbols. In addition, for $\chi = \{0, 1, 2, \ldots, k-1\}$ the encoder function $f_{enc}(\chi)$ returns k symbols $\{y_0, y_1, y_2, \ldots, y_{k-1}\}$ equal to the original set of k symbols used to construct the encoding function. Thus, the encoding function $f_{enc}(\chi)$ is systematic. The original k symbols used to construct the encoding function and carry useful (i.e., non-redundant) information can be transmitted, along with the n−k redundant symbols once generated, over an erasure channel for reception by a receiving device.

Figure 2:
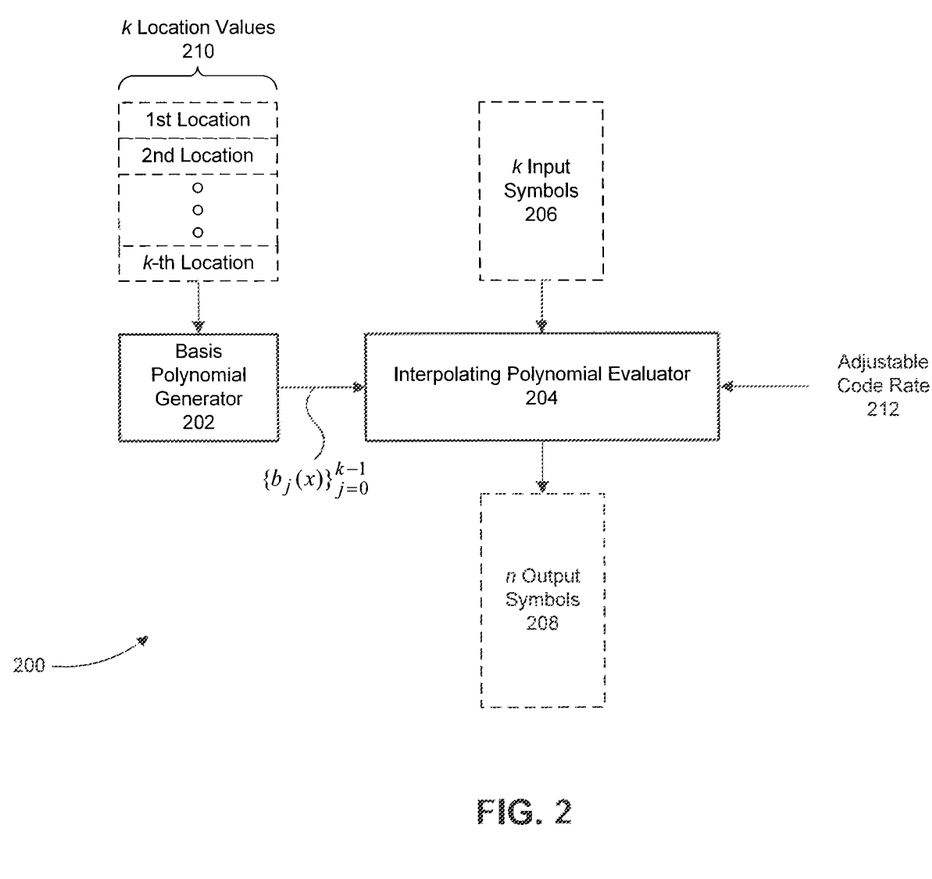
FIG. 2 illustrates a systematic, rate-independent Reed-Solomon (SR-RS) encoder in accordance with embodiments of the present disclosure.

FIG. 2 illustrates a systematic, rate-independent Reed-Solomon (SR-RS) encoder 200 configured to implement the encoding function $f_{enc}(\chi)$ in accordance with embodiments of the present disclosure. SR-RS encoder 200 can be implemented in a desktop computer, a laptop computer, a tablet, a smart phone, or a set-top box, for example.

As shown in FIG. 2, SR-RS encoder 200 includes a basis polynomial generator 202 and an interpolating polynomial evaluator 204. SR-RS encoder 200 is configured to encode k input symbols $\{y_0, y_1, y_2, \ldots, y_{k-1}\}$ 206 carrying useful (i.e., non-redundant information) into n output symbols $\{y_0, y_1, y_2, \ldots, y_{n-1}\}$ 208, in which the last n−k output symbols are carrying redundant information and the first k output symbols are equal to the k input symbols 206. Both the k input symbols 206 and the n output symbols are taken from the finite field consisting of the $2^m$ binary vectors of dimension m.

In operation, SR-RS encoder 200 interprets the k input symbols $\{y_0, y_1, y_2, \ldots, y_{k-1}\}$ 206 as corresponding to k points $\{(\chi_0, y_0), (\chi_1, y_1), (\chi_2, y_2), \ldots, (\chi_{k-1}, y_{k-})\}$ in a plane. The $\chi$ values of each of the k points are referred to as locations and the set of k location values 210 are provided to basis polynomial generator 202 as input. In the embodiment of SR-RS encoder 200, the set of k location values 210 are equal to the consecutive set of integers $\{0, 1, 2, \ldots, k-1\}$ for exemplary purposes. Basis polynomial generator 202 is configured to evaluate Eq. 3 above for each of the k location values 210 it receives to obtain k basis polynomials and provide the k basis polynomials to interpolating polynomial evaluator 204 as input. Basis polynomial generator 202 can evaluate Eq. 3 using various transforms, such as the fast Fourier transform or the fast Walsh-Hadamard transform.

In one embodiment, the k location values 210 are fixed and the same for each block of k input symbols 206 that SR-RS encoder 200 receives. In this embodiment, basis polynomial generator 202 can simply store the set of basis polynomials corresponding to the fixed set of k location values 210, rather than having to evaluate the function in Eq. 3.

Using the basis polynomials provided by basis polynomial generator 202, interpolating polynomial evaluator 204 is configured to evaluate Eq. 2 above at n−k unique values of $\chi$ (each different from the $\chi$ values of the k original points) to obtain n−k redundant symbols. Interpolating polynomial evaluator 204 can evaluate Eq. 2 using various transforms, such as the fast Fourier transform or the fast Walsh-Hadamard transform.

The original k symbols used to construct the encoding function and carry the useful (i.e., non-redundant) information and the n−k redundant symbols once generated are provided as output by interpolating polynomial evaluator 204 as the n output symbols 208 for transmission over an erasure channel. The value of n used by interpolating polynomial evaluator 204 can be adjusted to generate more or less redundant symbols using an adjustable code rate input signal 212.

A SR-RS decoder can be configured using the same structure as SR-RS encoder 200 in FIG. 2, except that: (1) the k input symbols 206 would correspond to any k received ones of the n encoded output symbols transmitted over the erasure channel, (2) the k location values 210 would correspond to the locations of those k received symbols in the sequence of the n encoded output symbols transmitted over the erasure channel, and (3) the output of the SR-RS decoder would be the k useful (i.e., non-redundant) symbols encoded by the encoder at the transmitter. To recover ones of the k useful (i.e., non-redundant) symbols that were erased and thus not received, the interpolating polynomial evaluator 204 would evaluate Eq. 2 at the corresponding $\chi$ values (or location values) of those erased symbols.

Figure 3:
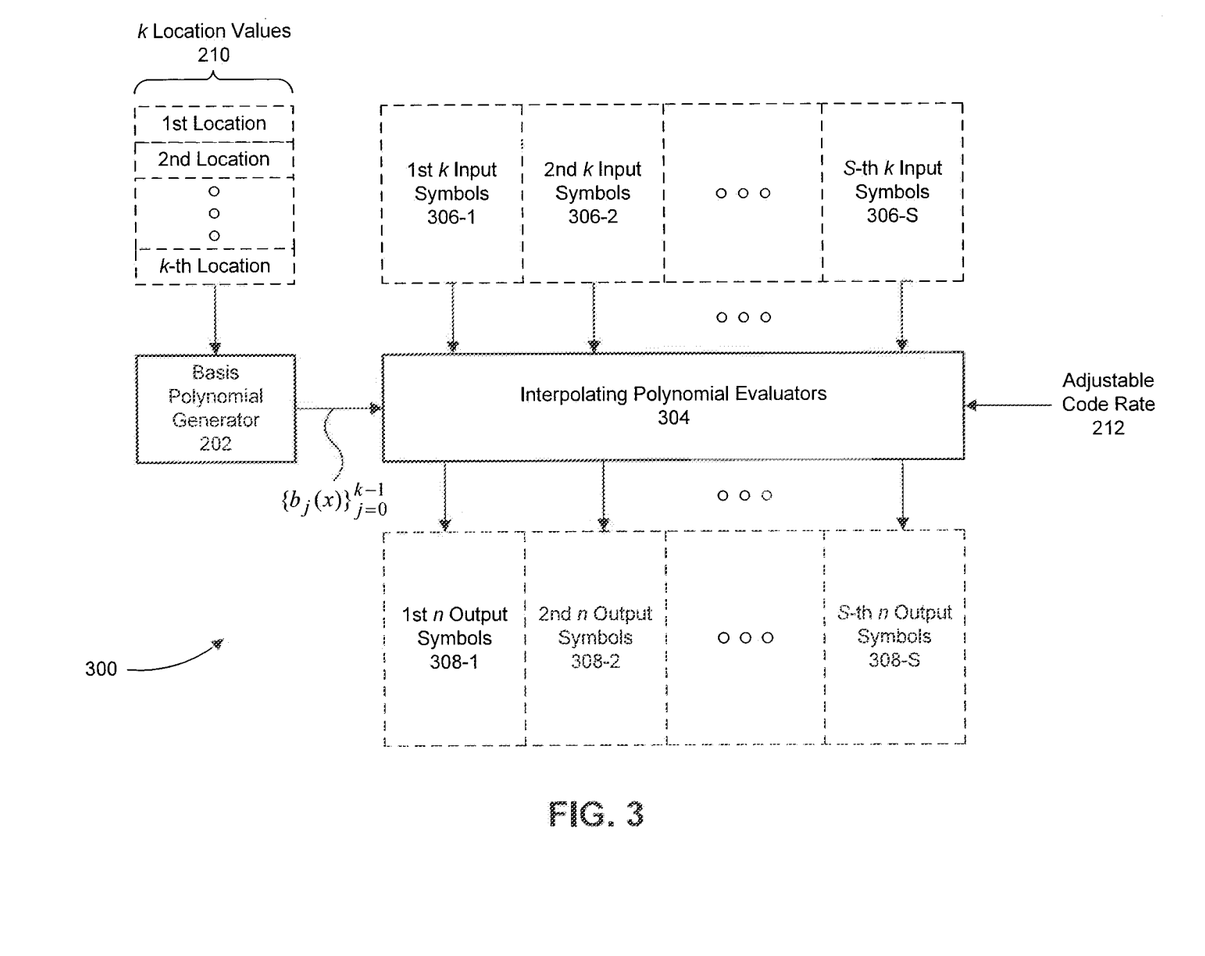
FIG. 3 illustrates a parallel implementation of an SR-RS encoder in accordance with embodiments of the present disclosure.

Referring now to FIG. 3, a systematic, rate-independent Reed-Solomon (SR-RS) encoder 300 configured to execute multiple copies of the encoding function $f_{enc}(x)$ in parallel is illustrated in accordance with embodiments of the present disclosure. SR-RS encoder 300 can be implemented in a desktop computer, a laptop computer, a tablet, a smart phone, or a set-top box, for example.

As shown in FIG. 3, SR-RS encoder 300 includes a substantially similar structure as SR-RS encoder 200 in FIG. 2. However, interpolating polynomial evaluator 204 in FIG. 2 has been replaced by interpolating polynomial evaluators 304 in FIG. 3. In general, interpolating polynomial evaluators 304 are configured to evaluate Eq. 2 in parallel for multiple sets of k input symbols 306 to generate multiple sets of n output symbols 308. Each of the interpolating polynomial evaluators 304 uses the same set of basis polynomials provided by basis polynomial generator 202. Thus, only one basis polynomial generator 202 is still needed.

It will be recognized by one of ordinary skill the art based on the teachings herein that a SR-RS decoder can be configured to use the same general structure as SR-RS encoder 300 in FIG. 3 with the same provisos as described above in regard to the SR-RS decoder configured to use the structure of SR-RS encoder 200 in FIG. 2. Such a SR-RS decoder can decode multiple sets of k received symbols in parallel.

Figure 4:
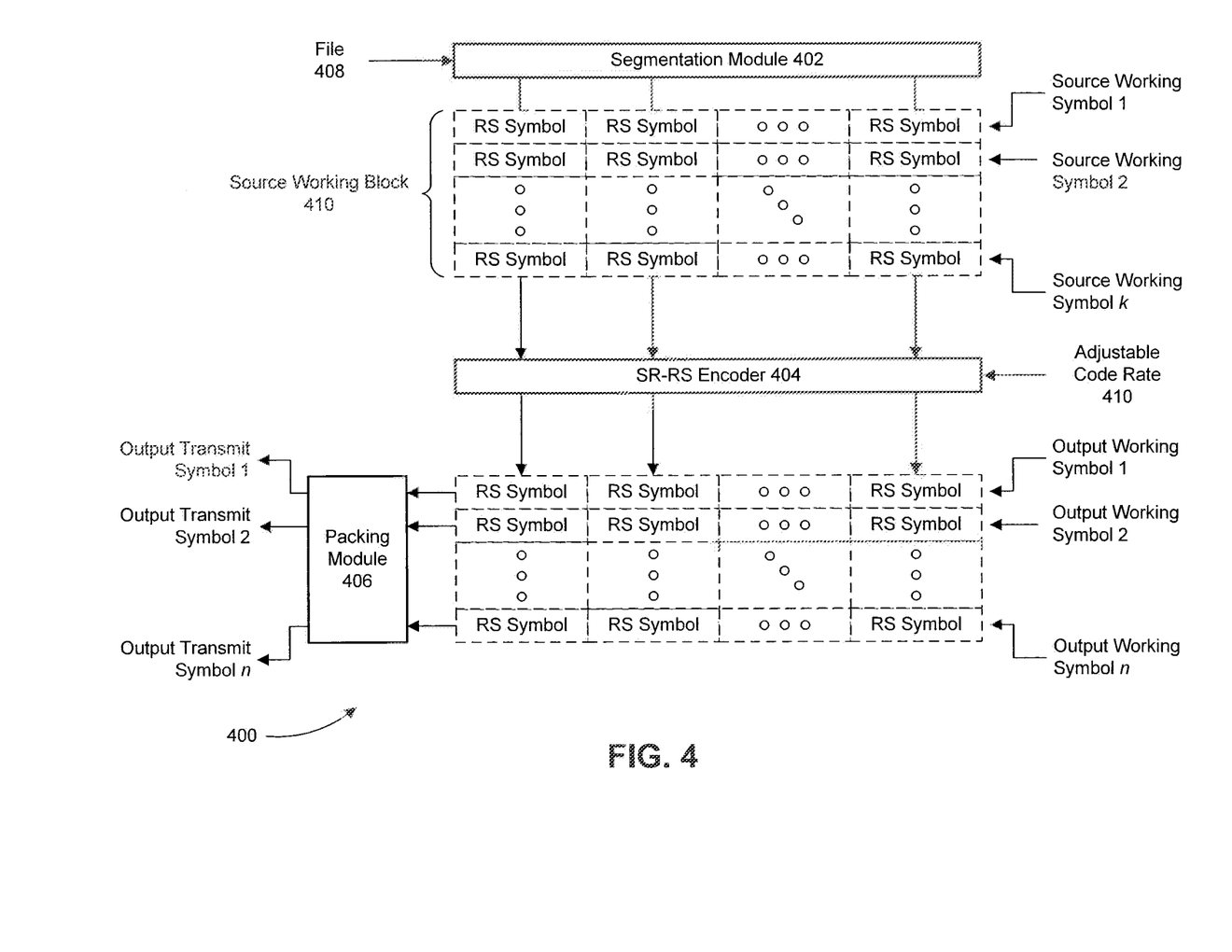
FIG. 4 illustrates a transmit payload module with a parallel implementation of an SR-RS encoder in accordance with embodiments of the present disclosure.

Referring now to FIG. 4, a transmit payload processor 400, that uses SR-RS encoder 200 or 300, is illustrated in accordance with embodiments of the present disclosure. Transmit payload processor 400 can be implemented in a desktop computer, a laptop computer, a tablet, a smart phone, or a set-top box, for example.

As shown in FIG. 4, transmit payload processor 400 includes a segmentation module 402, a SR-RS encoder 404, and a packing module 406. Transmit payload processor 400 is configured to segment a file into symbols for encoding and then pack the encoded symbols into transmit symbols for transmission over an erasure channel. In one embodiment, the transmit symbols are placed into a payload of a packet before being transmitted.

More specifically, transmit payload processor 400 receives a file 408 for transmission over an erasure channel. Before file 408 is encoded, it is segmented by segmentation module 402 into source working symbols and those source working symbols are grouped into source working blocks. For example, given a file 408 of size f bytes and a source working symbol of size tw bytes, file 402 can be divided into ceil(f/tw) source working symbols. A source working block is a collection of k source working symbols. An example source working block 410 is shown in FIG. 4, where each row of source working block 410 corresponds to a different source working symbol. In one embodiment, the size tw in bytes of the source working symbols is determined such than an entire source working block of k source working symbols can fit within the working memory of transmit payload processor 400.

Each of the k source working symbols of a source working block are further divided up into RS symbols of length m-bits for encoding by SR-RS encoder 404. This is further illustrated by example source working block 410. Each column of k RS symbols in example source working block 410 is processed either one at a time, in series, by SR-RS encoder 404 or at the same time, in parallel, by SR-RS encoder 404. If the columns of k RS symbols in example source working block 410 are processed in series, SR-RS encoder 404 can be implemented in a substantially similar manner as SR-RS encoder 200 in FIG. 2. If, on the other hand, the columns of k RS symbols in example source working block 410 are processed in parallel, SR-RS encoder 404 can be implemented in a substantially similar manner as SR-RS encoder 300 in FIG. 3.

SR-RS encoder 404 encodes each column of k RS symbols in example source working block 410 into n RS symbols, each of which are shown in FIG. 4 directly below the column of k RS symbols to which it corresponds. Each of the n rows of RS symbols generated by SR-RS encoder 404 is referred to as an output working symbol. The number of RS symbols n generated by SR-RS encoder 410 can be adjusted either up or down by adjustable code rate input signal 410 without having to reconstruct SR-RS encoder 404 for the same reason as encoders 200 and 300 described above in FIGS. 2 and 3, respectively.

Packing module 406 can pack or concatenate corresponding output working symbols generated by SR-RS encoder 404 together into output transmit symbols. For example, packing module 406 can pack or concatenate the first output working symbol (i.e., output working symbol 1) generated by SR-RS encoder 404 for two or more source working blocks to form output transmit symbol 1 shown in FIG. 4. The number of corresponding output working symbols packed or concatenated together to form an output transmit symbol can be determined based on a payload size of a packet in which the output transmit symbols are to be included for transmission over an erasure channel. In one embodiment, the output transmit symbols are each formed from only one output working symbol. In this embodiment, packing module 406 does no packing or concatenation, but simply passes each output working symbol produced by SR-RS encoder 404 through to a respective one of its outputs.

Figure 5:
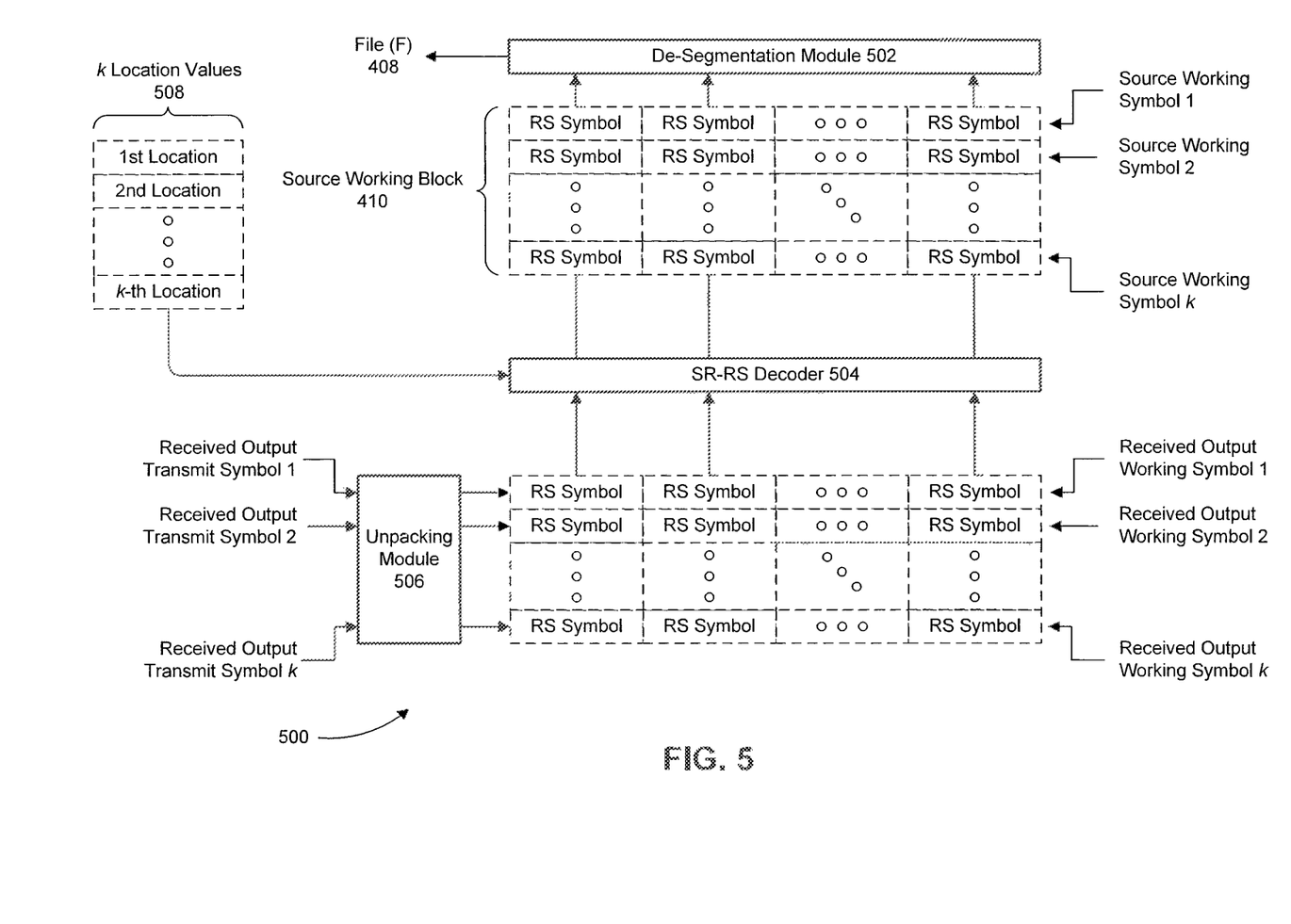
FIG. 5 illustrates a receive payload module with a parallel implementation of an SR-RS decoder in accordance with embodiments of the present disclosure.

Referring now to FIG. 5, a receive payload processor 500 is illustrated in accordance with embodiments of the present disclosure. Receive payload processor 500 can be implemented in a desktop computer, a laptop computer, a tablet, a smart phone, or a set-top box, for example, and is configured to perform the substantial inverse operation as the transmit payload processor 400 in FIG. 4.

As shown in FIG. 5, receive payload processor 500 includes a de-segmentation module 502, a SR-RS decoder 504, and an unpacking module 506. Once any k of the n output transmit symbols produced by the transmit payload processor 400 in FIG. 4 are received by unpacking module 506, decoding and recovery of any lost symbols can proceed. Unpacking module 506 is configured to unpack the k output transmit symbols into at least a first set of k output working symbols. Those k output working symbols together with their corresponding k location values 508 are provided as input to SR-RS decoder 504. SR-RS decoder 504 is configured in a similar manner as one of the decoders described above to recover one or more of the original k source working symbols that make up the source working block 410 operated on by the transmit payload processor 400 in FIG. 4. De-segmentation module 502 is configured to reconstruct the file 408 from source working block 410 and other source working blocks provided as output by SR-RS decoder 504.

It should be noted that the code rate used to encode the k output working symbols can be adjusted at the encoder without having to reconstruct the SR-RS decoder 504.

4. EXAMPLE COMPUTER SYSTEM IMPLEMENTATION

It will be apparent to persons skilled in the relevant art(s) that various elements and features of the present invention, as described herein, can be implemented in hardware using analog and/or digital circuits, in software, through the execution of instructions by one or more general purpose or special-purpose processors, or as a combination of hardware and software.

Figure 6:
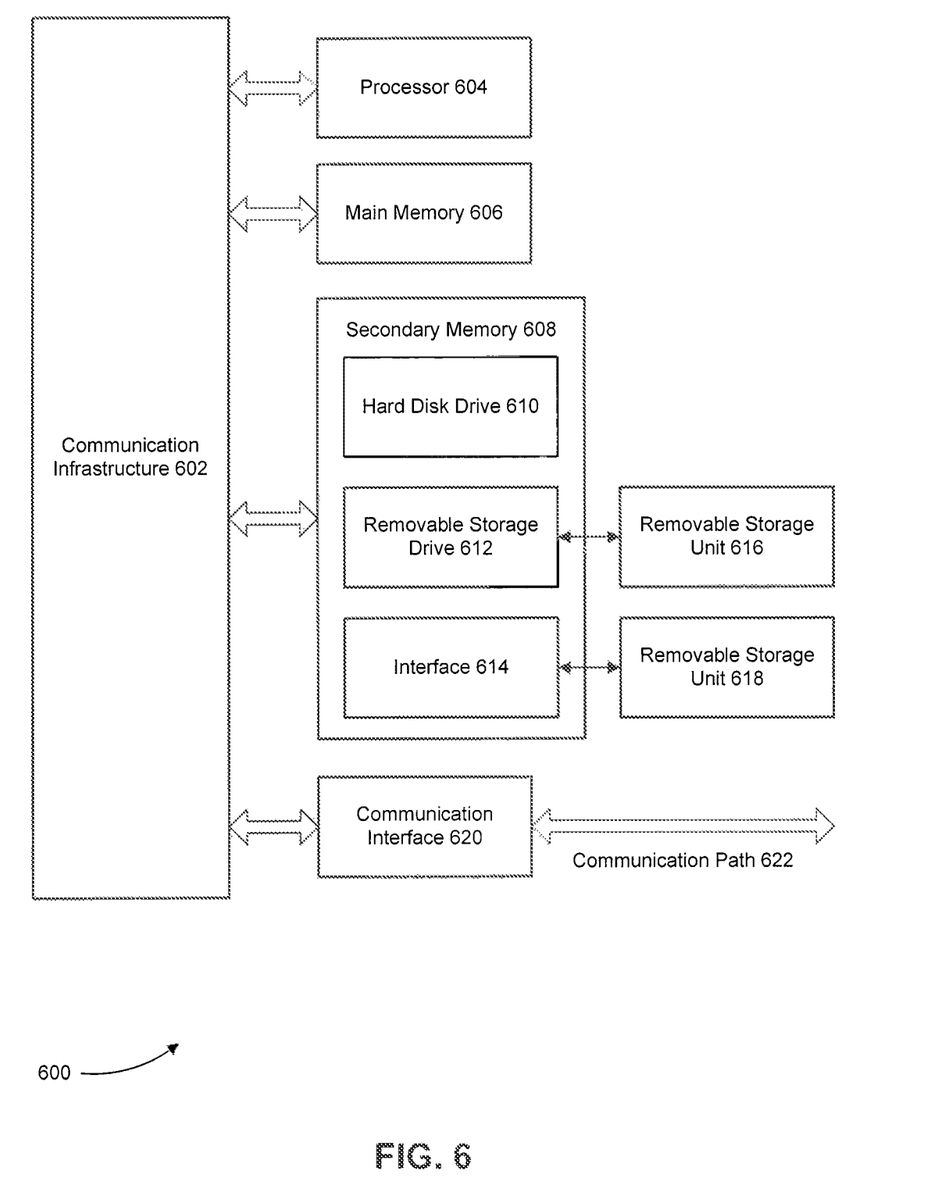
FIG. 6 illustrates a block diagram of an example computer system that can be used to implement aspects of the present disclosure.

The following description of a general purpose computer system is provided for the sake of completeness. Embodiments of the present invention can be implemented in hardware, or as a combination of software and hardware. Consequently, embodiments of the invention may be implemented in the environment of a computer system or other processing system. An example of such a computer system 600 is shown in FIG. 6. All of the block/modules depicted in FIGS. 2-5, for example, can execute on one or more distinct computer systems 600.

Computer system 600 includes one or more processors, such as processor 604. Processor 604 can be a special purpose or a general purpose digital signal processor. Processor 604 can be connected to a communication infrastructure 602 (for example, a bus or network). Various software implementations are described in terms of this exemplary computer system. After reading this description, it will become apparent to a person skilled in the relevant art(s) how to implement the invention using other computer systems and/or computer architectures.

Computer system 600 also includes a main memory 606, preferably random access memory (RAM), and may also include a secondary memory 608. Secondary memory 608 may include, for example, a hard disk drive 610 and/or a removable storage drive 612, representing a floppy disk drive, a magnetic tape drive, an optical disk drive, or the like. Removable storage drive 612 reads from and/or writes to a removable storage unit 616 in a well-known manner. Removable storage unit 616 represents a floppy disk, magnetic tape, optical disk, or the like, which is read by and written to by removable storage drive 612. As will be appreciated by persons skilled in the relevant art(s), removable storage unit 616 includes a computer usable storage medium having stored therein computer software and/or data.

In alternative implementations, secondary memory 608 may include other similar means for allowing computer programs or other instructions to be loaded into computer system 600. Such means may include, for example, a removable storage unit 618 and an interface 614. Examples of such means may include a program cartridge and cartridge interface (such as that found in video game devices), a removable memory chip (such as an EPROM, or PROM) and associated socket, a thumb drive and USB port, and other removable storage units 618 and interfaces 614 which allow software and data to be transferred from removable storage unit 618 to computer system 600.

Computer system 600 may also include a communications interface 620. Communications interface 620 allows software and data to be transferred between computer system 600 and external devices. Examples of communications interface 620 may include a modem, a network interface (such as an Ethernet card), a communications port, a PCMCIA slot and card, etc. Software and data transferred via communications interface 620 are in the form of signals which may be electronic, electromagnetic, optical, or other signals capable of being received by communications interface 620. These signals are provided to communications interface 620 via a communications path 622. Communications path 622 carries signals and may be implemented using wire or cable, fiber optics, a phone line, a cellular phone link, an RF link and other communications channels.

As used herein, the terms "computer program medium" and "computer readable medium" are used to generally refer to tangible storage media such as removable storage units 616 and 618 or a hard disk installed in hard disk drive 610. These computer program products are means for providing software to computer system 600.

Computer programs (also called computer control logic) are stored in main memory 606 and/or secondary memory 608. Computer programs may also be received via communications interface 620. Such computer programs, when executed, enable the computer system 600 to implement the present invention as discussed herein. In particular, the computer programs, when executed, enable processor 604 to implement the processes of the present invention, such as any of the methods described herein. Accordingly, such computer programs represent controllers of the computer system 600. Where the invention is implemented using software, the software may be stored in a computer program product and loaded into computer system 600 using removable storage drive 612, interface 614, or communications interface 620.

In another embodiment, features of the invention are implemented primarily in hardware using, for example, hardware components such as application-specific integrated circuits (ASICs) and gate arrays. Implementation of a hardware state machine so as to perform the functions described herein will also be apparent to persons skilled in the relevant art(s).

5. CONCLUSION

The present disclosure has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

What is claimed is:

1. A transmit payload processor comprising: a segmentation module configured to segment a file into k source working symbols; a systematic, rate-independent Reed-Solomon (SR-RS) encoder configured to encode the k source working symbols into n output working symbols, wherein the SR-RS encoder comprises a first interpolating polynomial evaluator configured to evaluate a first interpolation polynomial, constructed from a first linear combination of basis polynomials, at n–k distinct locations that are different from k locations of the k source working symbols; and a packing module configured to pack the n output working symbols into output transmit symbols for transmission over an erasure channel, wherein the segmentation module, the SR-RS encoder and the packing module are each implemented at least in part using hardware.

2. The transmit payload processor of claim 1, wherein the SR-RS encoder comprises:
a second interpolating polynomial evaluator configured to evaluate a second interpolation polynomial, constructed from a second linear combination of the same basis polynomials used by the first interpolating polynomial evaluator, at the n–k distinct locations.

3. The transmit payload processor of claim 2, wherein the first linear combination of the basis polynomials is determined based on the k source working symbols, and the second linear combination of the same basis polynomials is determined based on a different set of k source working symbols.

4. The transmit payload processor of claim 2, wherein the first interpolating polynomial evaluator and the second interpolating polynomial evaluator are configured to operate in parallel.

5. The transmit payload processor of claim 1, wherein the first interpolating polynomial evaluator is configured to evaluate the first interpolation polynomial using the fast Walsh-Hadamard transform.

6. The transmit payload processor of claim 1, wherein the first interpolating polynomial evaluator is configured to evaluate the first interpolation polynomial using the fast Fourier transform.

7. The transmit payload processor of claim 1, wherein n is adjusted based on a change in a condition of the erasure channel.

8. The transmit payload processor of claim 1, wherein n is adjusted based on a change in a condition of the erasure channel without having to reconstruct the SR-RS encoder.

9. A receive payload processor comprising:
    an unpacking module configured to unpack k output working symbols from k output transmit symbols received over an erasure channel;
    a systematic, rate-independent Reed-Solomon (SR-RS) decoder configured to recover k or less source working symbols from the k output working symbols, wherein the SR-RS decoder comprises a first interpolating polynomial evaluator configured to evaluate a first interpolation polynomial, constructed from a first linear combination of basis polynomials, at k or less distinct locations; and
    a de-segmentation module configured to de-segment a file using the recovered k or less source working symbols, wherein the unpacking module, the SR-RS decoder and the de-segmentation module are each implemented at least in part using hardware.

10. The receive payload processor of claim 9, wherein the SR-RS decoder comprises:
    a second interpolating polynomial evaluator configured to evaluate a second interpolation polynomial, constructed from a second linear combination of the same basis polynomials used by the first interpolating polynomial evaluator, at the k or less distinct locations.

11. The receive payload processor of claim 10, wherein the first linear combination of the basis polynomials is determined based on the k output working symbols, and the second linear combination of the same basis polynomials is determined based on a different set of k output working symbols.

12. The receive payload processor of claim 10, wherein the first interpolating polynomial evaluator and the second interpolating polynomial evaluator are configured to operate in parallel.

13. The receive payload processor of claim 9, wherein the first interpolating polynomial evaluator is configured to evaluate the first interpolation polynomial using the fast Walsh-Hadamard transform.

14. The receive payload processor of claim 9, wherein the first interpolating polynomial evaluator is configured to evaluate the first interpolation polynomial using the fast Fourier transform.

15. The receive payload processor of 9, wherein the receive payload processor is implemented in a desktop computer, a laptop computer, a tablet, a smart phone, or a set-top box.

16. A systematic, rate-independent Reed-Solomon (SR-RS) coding module comprising:
    a basis polynomial generator configured to generate basis polynomials based on k locations;
    a first interpolating polynomial evaluator configured to evaluate a first interpolation polynomial, constructed from a first linear combination of the basis polynomials, at a first set of one or more distinct locations that are different from the k locations, wherein a number of distinct locations in the first set is adjusted to adjust a code rate of the SR-RS coding module; and
    a second interpolating polynomial evaluator configured to evaluate a second interpolation polynomial, constructed from a second linear combination of the basis polynomials, at a second set of one or more distinct locations that are different from the k locations, wherein a number of distinct locations in the second set is adjusted to adjust the code rate of the SR-RS coding module, wherein the basis polynomial generator, the first interpolating polynomial evaluator and the second interpolating polynomial evaluator are each implemented at least in part using hardware.

17. The SR-RS coding module of claim 16, wherein the first linear combination of the basis polynomials is determined based on k symbols to be transmitted over an erasure channel, wherein the k locations correspond to the k symbols.

18. The SR-RS coding nodule of claim 16, wherein the first interpolating polynomial evaluator and the second interpolating polynomial evaluator are configured to operate in parallel.

19. The SR-RS coding module of claim 16, wherein the first interpolating polynomial evaluator is configured to evaluate the first interpolation polynomial using the fast Walsh-Hadamard transform.

20. The SR-RS coding module of claim 16, wherein the SR-RS coding module is implemented in a desktop computer, a laptop computer, a tablet, a smart phone, or a set-top box.

\* \* \* \* \*

UNITED STATES PATENT AND TRADEMARK OFFICE
CERTIFICATE OF CORRECTION

PATENT NO. : 9,287,897 B2
APPLICATION NO. : 13/754334
DATED : March 15, 2016
INVENTOR(S) : Shen et al.

Page 1 of 1

It is certified that error appears in the above-identified patent and that said Letters Patent is hereby corrected as shown below:

In the Claims

In column 12, line 37, please replace "nodule" with --module--.

Signed and Sealed this
Thirty-first Day of May, 2016

Michelle K. Lee
*Director of the United States Patent and Trademark Office*